US006995475B2

(12) United States Patent
Biggs et al.

(10) Patent No.: US 6,995,475 B2
(45) Date of Patent: Feb. 7, 2006

(54) I/C CHIP SUITABLE FOR WIRE BONDING

(75) Inventors: Julie C. Biggs, Wappingers Falls, NY (US); Tien-Jen Cheng, Bedford, NY (US); David E. Eichstadt, North Salem, NY (US); Lisa A. Fanti, Hopewell Junction, NY (US); Jonathan H. Griffith, Poughkeepsie, NY (US); Randolph F. Knarr, Goldens Bridge, NY (US); Sarah H. Knickerbocker, Hopewell Junction, NY (US); Kevin S. Petrarca, Newburgh, NY (US); Roger A. Quon, Beacon, NY (US); Wolfgang Sauter, Richmond, VT (US); Kamalesh K. Srivastava, Wappingers Falls, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/666,775

(22) Filed: Sep. 18, 2003

(65) Prior Publication Data
US 2005/0062170 A1 Mar. 24, 2005

(51) Int. Cl.
*H01L 23/48* (2006.01)
*H01L 23/52* (2006.01)
*H01L 29/40* (2006.01)
(52) U.S. Cl. ...................... 257/784; 257/737; 257/761; 257/766
(58) Field of Classification Search ................ 257/737, 257/738, 779, 780, 781, 784, 741, 761, 766; 438/612–614, 617
See application file for complete search history.

(56) References Cited

U.S. PATENT DOCUMENTS

| 5,885,891 | A | 3/1999 | Miyata et al. ............... 438/612 |
| 6,077,766 | A | 6/2000 | Sebesta et al. .............. 438/618 |
| 6,376,371 | B1 | 4/2002 | Jain et al. .................... 438/681 |
| 6,387,793 | B1 | 5/2002 | Yap et al. .................... 438/612 |
| 6,534,863 | B2 * | 3/2003 | Walker et al. ............... 257/737 |
| 6,614,113 | B2 * | 9/2003 | Watanabe et al. ........... 257/750 |
| 6,620,720 | B1 * | 9/2003 | Moyer et al. ................ 438/612 |
| 6,649,507 | B1 * | 11/2003 | Chen et al. .................. 438/614 |
| 6,706,622 | B1 * | 3/2004 | McCormick ................. 438/614 |
| 6,762,122 | B2 * | 7/2004 | Mis et al. .................... 438/683 |

* cited by examiner

OTHER PUBLICATIONS

IBM Technical Disclosure Bulletin, "Electroless Gold Plating of Thick Films", M. M. Haddad, vol. 16, No. 4, Sep., 1973.

*Primary Examiner*—Thanhha Pham
(74) *Attorney, Agent, or Firm*—William N. Hogg

(57) ABSTRACT

A method of forming wire bonds in (I/C) chips comprising: providing an I/C chip having a conductive pad for a wire bond with at least one layer of dielectric material overlying the pad; forming an opening through the dielectric material exposing a portion of said pad. Forming at least a first conductive layer on the exposed surface of the pad and on the surface of the opening. Forming a seed layer on the first conductive layer; applying a photoresist over the seed layer; exposing and developing the photoresist revealing the surface of the seed layer surrounding the opening; removing the exposed seed layer; removing the photoresist material in the opening revealing the seed layer. Plating at least one second layer of conductive material on the seed layer in the opening, and removing the first conductive layer on the dielectric layer around the opening. The invention also includes the resulting structure.

3 Claims, 4 Drawing Sheets

I/C CHIP SUITABLE FOR WIRE BONDING

FIELD OF THE INVENTION

The invention generally relates to manufacturing integrated circuit (I/C) chips and, more particularly, to a technique for forming wire bonded I/C chips, and the resulting structure.

BACKGROUND OF THE INVENTION

Wire bonding is well-known in the art and used widely to interconnect chips with chip carriers. Traditionally, a gold wire is bonded to an aluminum pad. There are several limitations of this method. The intermetallics formed between gold and aluminum may reduce the reliability of the bond. Additionally, the robustness of the bonding process is compromised by bonding dissimilar metals. In advanced CMOS technology, copper metallization and low-k dielectrics, e.g. FSG (fluorinated silica glass), SiLK (a polyarelene ether by Dow Chemical), are used and, for even more advanced applications, porous, very weak materials are employed. This stage is sometimes referred to as the Back End of the Line (BEOL). The BEOL circuit structure is low modulus and sensitive to damage by pressure. The top aluminum surface, normally covered by a layer of oxide, must be removed in order to form a good contact between the test probe and the pad metal. This probe movement is called "scrubbing" or "plowing". Therefore, the chip is subjected to potential mechanical damage. It is highly desirable to establish an I/O pad that does not require scrubbing to provide low contact resistance with test probes. Currently, because of the need to "plow" into top aluminum, the pad size has to be quite large. This limits the chip design for higher I/O counts or results in an increased chip size. The pad size is often double the size needed for bonding, since the probing area can become so damaged that it cannot be used for bonding.

SUMMARY OF THE INVENTION

A method of forming a wire bond structure in an integrated circuit (I/C) chip comprising the steps of: providing an I/C chip having a conductive pad for attaching to a wire bond with at least one layer of dielectric material overlying the pad for the wire bond; then forming an opening through said at least one layer of dielectric material to expose a portion of said pad for said wire bond. Thereafter, forming at least a first conductive layer on said exposed surface of said pad for said wire bond and on the surface and in the said opening in said layer of dielectric material, and then forming a seed layer on said first conductive layer. Then applying a photoresist material over said seed layer, exposing and developing said photoresist layer to reveal the surface of said seed layer surrounding said opening in said dielectric material, removing the exposed seed layer, and removing the photoresist material in said opening to reveal the seed layer thereunder. Then plating at least one layer of conductive material on said seed layer in said opening, and removing the remaining portion of said first conductive layer of conductive material on said dielectric layer around said opening. The invention also includes the resulting structure.

DESCRIPTION OF THE PREFERRED EMBODIMENT(S)

Figure 1:
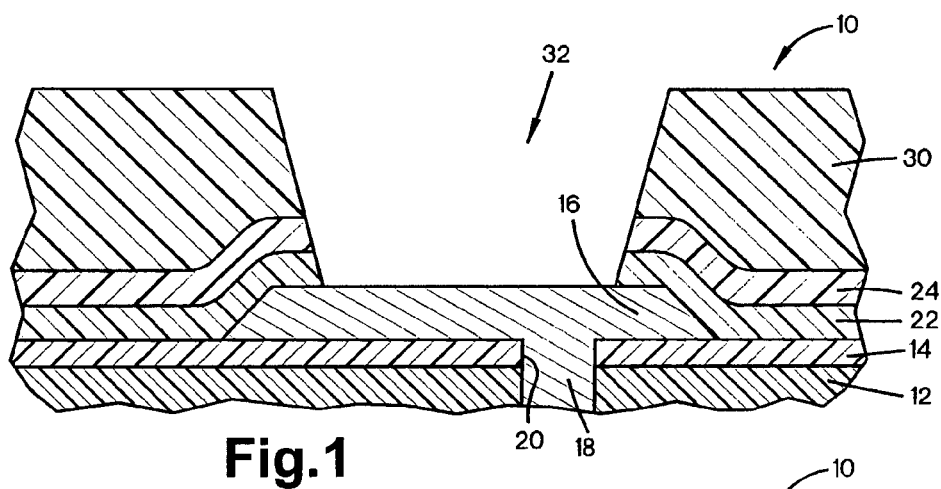
FIGS. 1–8 show schematically the steps in forming a wire bond connection on an I/C chip according to this invention.

Referring now to the drawings, and for the present to FIG. 1, a portion of an I/C chip 10 at the stage of production where a wire bond pad is to be formed is shown. Only the topmost layers and only one half of the pad area of the chip are shown. Also, the method described herein is performed at the wafer level. This stage is sometimes referred to as the Back End Of the Line (BEOL). The chip 10 includes an $SiO_2$ or other dielectric layer 12, typically about 0.5 um thick, with an $Si_3N_4$ layer 14, typically about 0.5 um thick, thereon. A layer of aluminum 16, typically 1 to 2 um thick, is deposited on the layer 14, which Al layer 16 has an extension 18 extending through opening 20 in layers of $SiO_2$ 12, and $Si_3N_4$ 14. Another layer of $SiO_2$ or other dielectric material 22, typically about 0.5 um thick, is deposited on an $Si_3N_4$ layer and on the aluminum layer 18, and another layer 24 of $Si_3N_4$, typically about 0.5 um thick, is deposited on $SiO_2$ layer 22. A layer of dielectric material, preferably a polyimide and more preferably a photosensitive polyimide 30, typically about 6 um thick, is deposited over the layer 24 of $Si_3N_4$, and an opening 32 is formed through the polyimide 30, the $Si_3N_4$ layer 24 and the $SiO_2$ layer 22. If the polyimide is photosensitive, preferably the opening 32 is formed by conventional expose and develop techniques. If the polyimide 30 is not photosensitive, the opening 32 is preferably formed by a method using laser and mask. As indicated earlier, this represents the stage of formation of a portion of the I/C chip 10 when it is ready to have the wire bond pad formed according to this invention. Since the processing of the chip to this point can be conventional, such processing need not be described in any detail.

Figure 2:
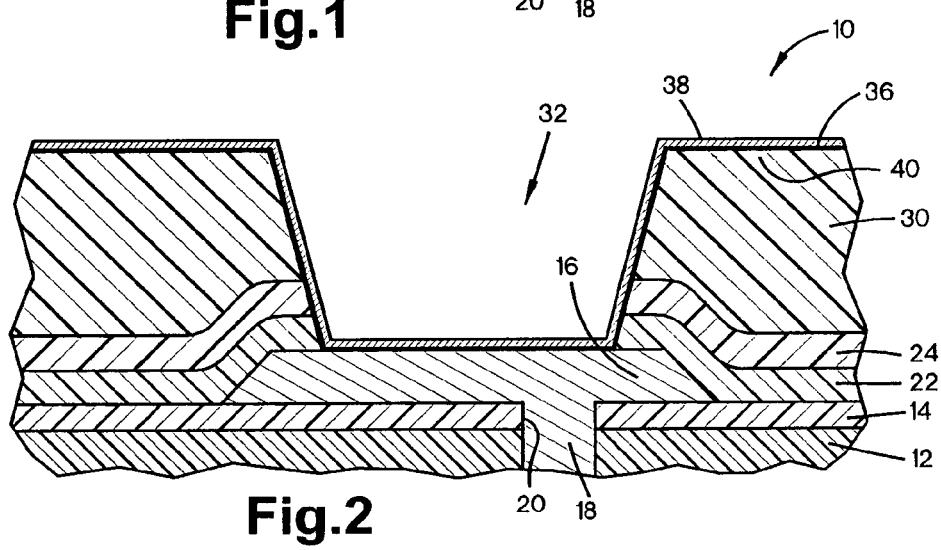

FIGS. 2–8 depict the various steps in forming the wire bond pads according to this invention. Referring now to FIG. 2, layers of TaN/Ta 36 and Cu 38 are sputter deposited by techniques, familiar to those versed in the art, on the layer of polyimide 30, and in the opening 32 included on the exposed surface of the Al layer 16 and the sidewalls of the opening 32. The sputtering process is conventional, with the TaN being deposited first, about 100 A to 800 A, and then the Ta, also about 100 A to 800 A, to form the TaN/Ta layer 36, then the Cu layer 38 (about 1500 A to 5000 A). The Cu will act as a seed layer for electro-deposition of metal, as will be described presently. It is also believed that, during the sputter deposition process of the TaN/Ta, the top surface of the polyimide 30 is carbonized to form a thin layer of carbonaceous material 40. Since this carbonaceous material is conductive (as opposed to the polyimide itself), when current is applied, the carbonaceous material will add to the conductivity of the layers 36 and 38, as will be explained presently.

Figure 3:
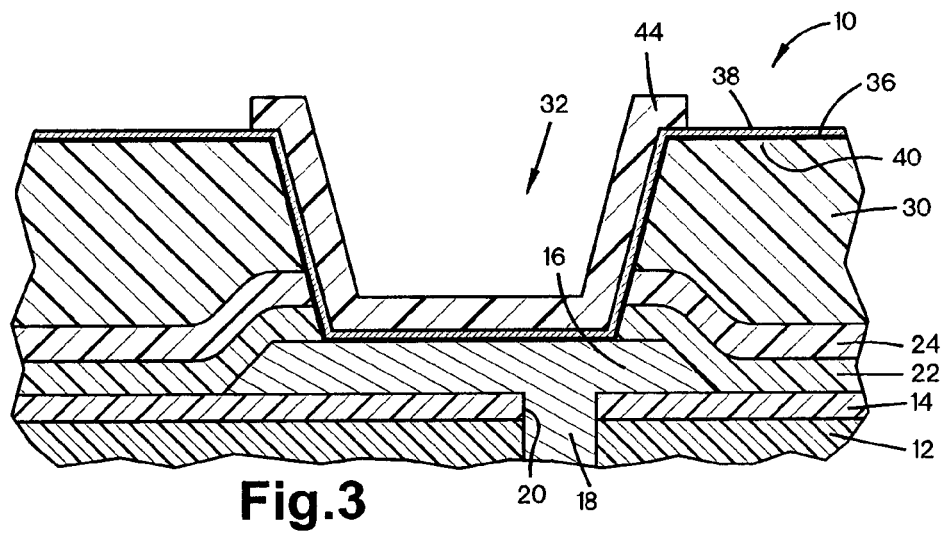

Referring now to FIG. 3, a photoresist 44 is applied over the copper layer 38, typically about 0.5 to 3.0 um thick, and photopatterened and developed in a conventional manner to reveal all of the copper layer 38, except that which is in the opening 32. Although either positive or negative photoresist can be used, positive is preferred since it works well with copper, which is the seed layer.

Figure 4:
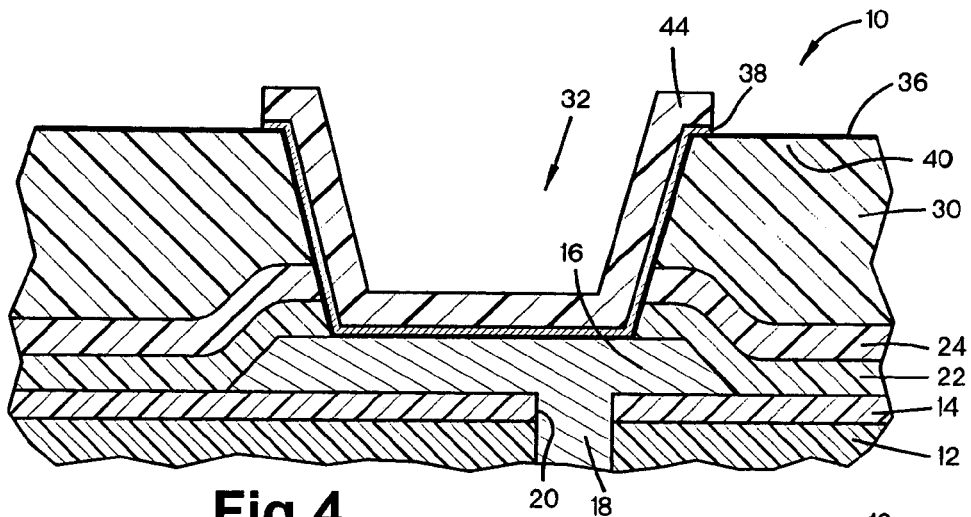

Referring now to FIG. 4, the exposed copper seed layer is removed, preferably by electroetching. This is a conventional process and techniques for this are shown in U.S.

patents, e.g. by Datta et al in U.S. Pat. No. 5,486,282, and by Dinan et al in U.S. Pat. No. 5,536,388.

Figure 5:
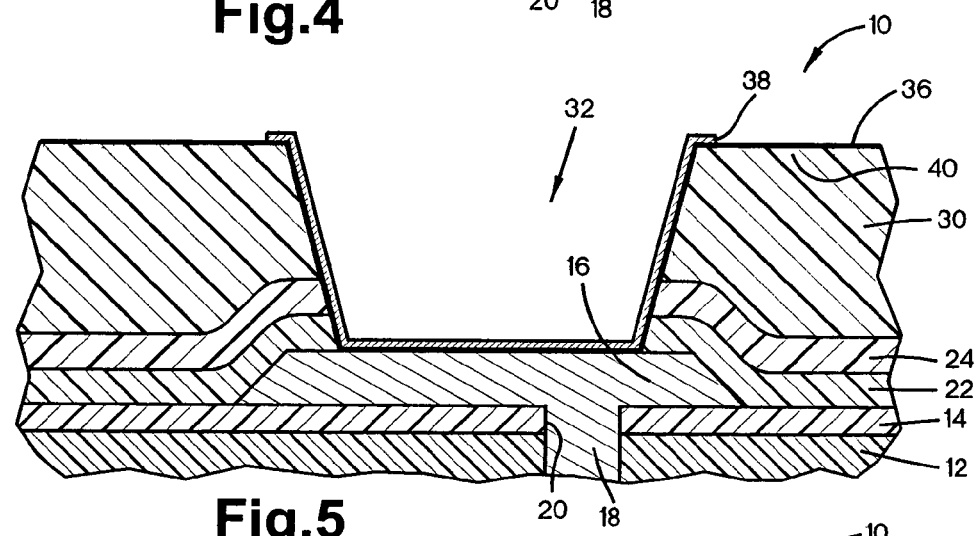

The photoresist in the opening 32 is removed by a conventional process, such as in a strong base to produce the structure shown in FIG. 5, which has the copper seed layer 38 remaining only in the opening 32.

Figure 6:
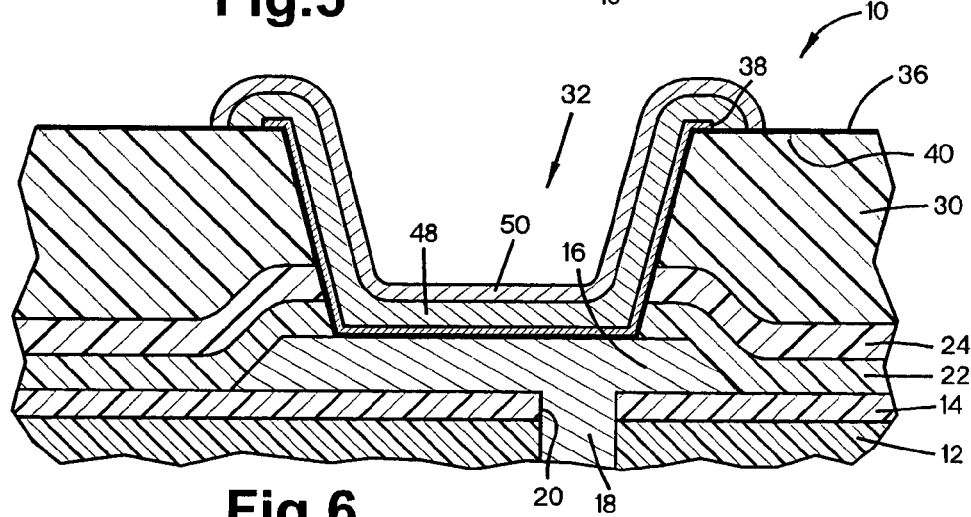

Referring now to FIG. 6, layers of Ni 48, then gold 50, are electroplated onto the revealed copper seed layer 38 in opening 32. The electroplating process is conventional, using the TaN/Ta layer 36, the carbonaceous layer 40 and the copper layer 38, where it exists as electrical conductors. Thus, the carbonizing of the surface of the polyimide 30 has a positive, beneficial effect for electroplating. Electroplating or electrochemical deposition, is widely used in the industry to deposit metals on wafers or substrates. A cathodic current is applied to a wafer surface in either a nickel or gold plating tank. Based on plating time and applied currents, the amount of metal plated is controlled. The Ni is plated to a thickness of about 0.2 to 2 microns, and the Au is plated to a thickness of about 0.2 to 1 micron. The plating takes place only on the Cu layer 38, and not on the TaN/Ta layer 36. Also, the plating of the Au preferably takes place immediately after the Ni plating to avoid any possible oxidation of the Ni. The plating ceases when the configuration has reached that shown in FIG. 6, and only minimally overlies the surface of the polyimide 30 surrounding the opening 32. Thus, as can be seen in FIG. 6, an augmented bond pad of TaN/Ta/Cu/Ni/Au is provided in the opening 32 which includes the side walls as well as the bottom of the opening 32. Therefore, assuming that the size of the original Al bond pad 16 exposed in the opening 32 is 92 microns×48 microns, by using the side walls of the opening, the conductive area of the original bond pad is augmented by more than 30%, e.g. about 38%.

Figure 7:
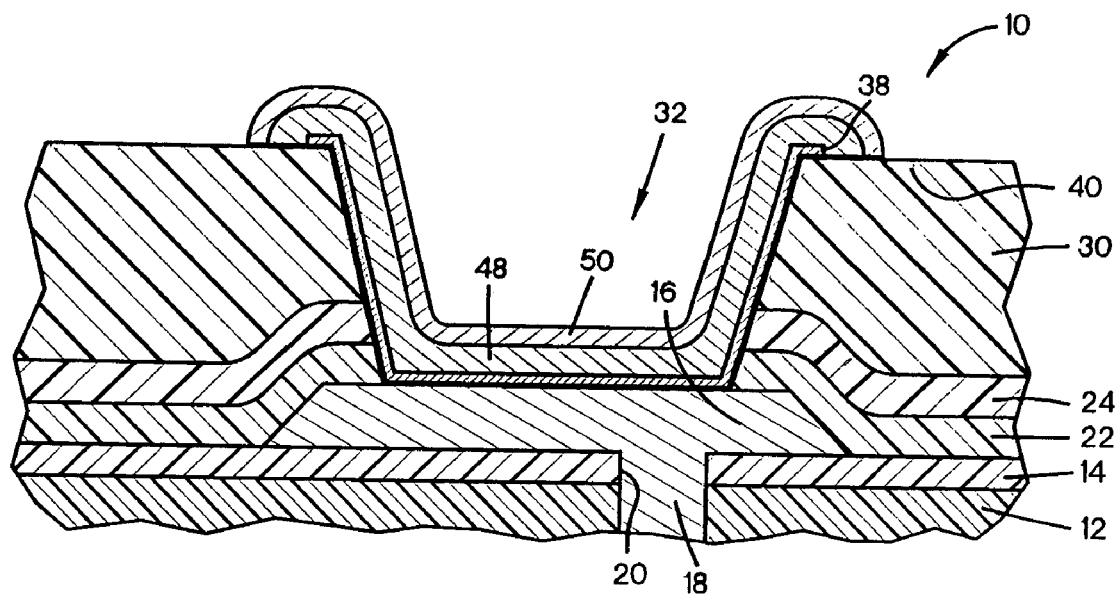
Figure 8:
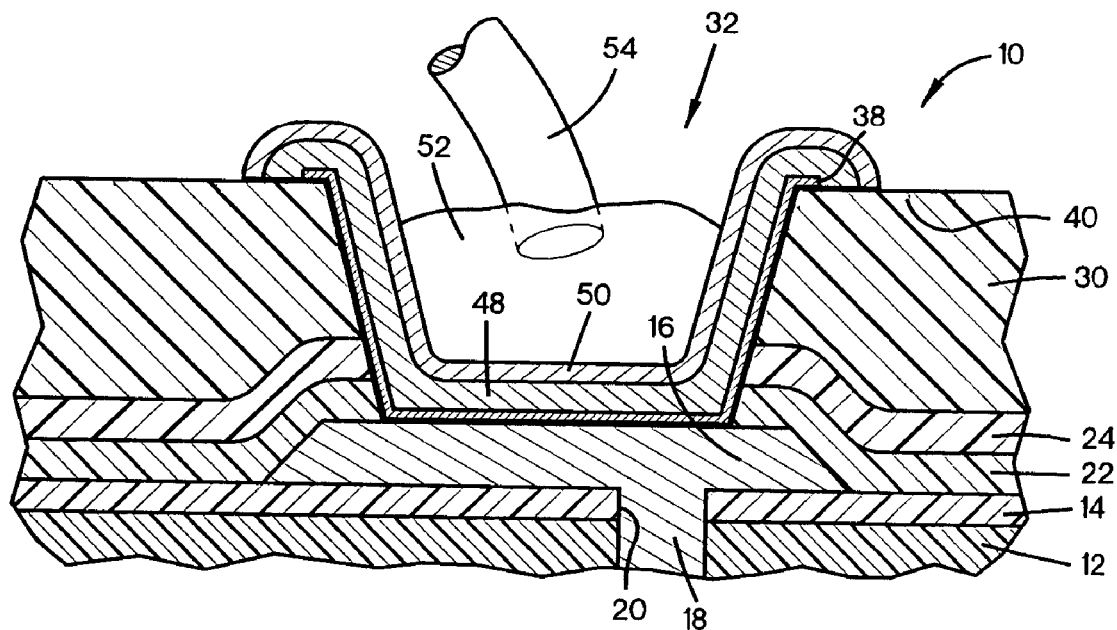
Figure 9:
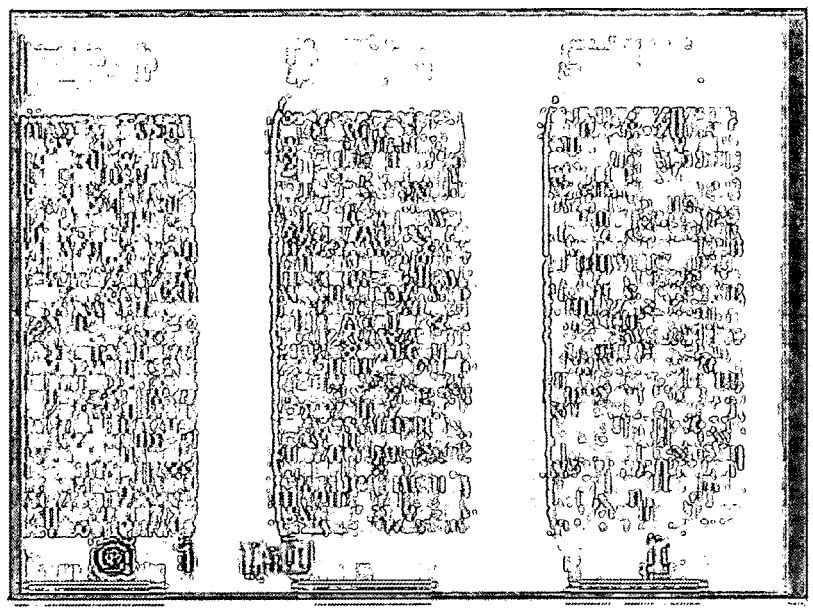
FIG. 9 is a photomicrograph of the plated Ni/Au wire bond pad.
Figure 10:
FIG. 10 is a photomicrograph of the side wall of the Ni/Au wire bond pad.

Referring now to FIG. 7, the remaining TaN/Ta layer and remaining carbonaceous layer 40 are removed by plasma etching in a $CF_4$ based plasma using a standard etch tool to remove the TaN/Ta layer 38 and an oxygen plasma to remove the carbonaceous layer 40. The chip is now ready to receive a gold ball bond 52 and wire 54 as shown in FIG. 8. The gold bond is comprised of the gold ball 52 which is formed by heating the gold wire 54 as is commonly practiced in the art. The bonding is preferably done by ultrasonic techniques, pressing the wire 54 and the ball 52 into the bond pad. This results in a strong, electrically efficient bond of the wire 54 to the Au of the Ni/Au layer 48 as shown in FIGS. 9 and 10. For illustration purpose, as noticed in FIG. 10, only one sidewall is covered with gold metal. Ideally, all sidewalls are covered to maximize the bonding surface.

What is claimed is:

1. An I/C chip suitable for wire bonding comprising:
   at least one conductive bond pad;
   at least one layer of dielectric material overlying said conductive bond pad;
   a surface defining an opening in said layer of dielectric material exposing said conductive bond pad;
   an intermediate conductive layer of TaN/Ta disposed in said opening overlying said conductive bond pad and in contact therewith and in contact with the entire surface of said opening and a top surface of said layer of dielectric material;
   a conductive seed layer disposed in said opening, overlying said intermediate conductive layer and in contact therewith and overlying said top surface of said layer of dielectric material, said conductive seed layer having exposed edges;
   two layers of Ni and Au plated on said conductive seed layer in said opening, overlying said conductive seed layer and completely covering said conductive seed layer including all exposed edges, said two layers of Ni and Au define walls in said opening in which a ball bond and wire is wholly disposed.

2. The I/C chip as defined in claim 1 wherein the conductive bond pad in the I/C chip is Al.

3. The I/C chip as defined in claim 1 wherein the ball bond is Au.

* * * * *